United States Patent
Milo et al.

(10) Patent No.: US 10,361,098 B2
(45) Date of Patent: Jul. 23, 2019

(54) QFN PIN ROUTING THRU LEAD FRAME ETCHING

(71) Applicant: TEXAS INSTRUMENTS INCORPORATED, Dallas, TX (US)

(72) Inventors: Dolores Babaran Milo, Baguio (PH); Cherry Lyn Marquez Aranas, Mabalacat (PH)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 15/848,336

(22) Filed: Dec. 20, 2017

(65) Prior Publication Data

US 2018/0182642 A1    Jun. 28, 2018

Related U.S. Application Data

(60) Provisional application No. 62/438,925, filed on Dec. 23, 2016.

(51) Int. Cl.
| | |
|---|---|
| *H01L 23/495* | (2006.01) |
| *H01L 21/48* | (2006.01) |
| *H01L 23/31* | (2006.01) |
| *H01L 23/00* | (2006.01) |

(52) U.S. Cl.
CPC ...... *H01L 21/4828* (2013.01); *H01L 23/3121* (2013.01); *H01L 23/49541* (2013.01); *H01L 23/49548* (2013.01); *H01L 24/48* (2013.01); *H01L 24/49* (2013.01); *H01L 2224/48108* (2013.01); *H01L 2224/48177* (2013.01); *H01L 2224/4917* (2013.01);

(Continued)

(58) Field of Classification Search
CPC ........... H01L 21/4828; H01L 23/49541; H01L 24/49; H01L 24/48; H01L 23/49548; H01L 23/3121; H01L 2224/49175; H01L 2224/48177; H01L 2224/49177; H01L 2224/49171; H01L 2224/4917; H01L 2224/48108
USPC .......................................... 257/666; 438/123
See application file for complete search history.

(56) References Cited

U.S. PATENT DOCUMENTS

| | | | | |
|---|---|---|---|---|
| 5,569,625 A | * | 10/1996 | Yoneda ................. | H01L 21/565 257/E21.504 |
| 6,917,098 B1 | * | 7/2005 | Yamunan ............ | H01L 23/4951 257/666 |
| 8,203,199 B2 | | 6/2012 | Lee et al. | |

(Continued)

*Primary Examiner* — Selim U Ahmed
(74) *Attorney, Agent, or Firm* — Dawn Jos; Charles A. Brill; Frank D. Cimino

(57) ABSTRACT

A multi-level leadframe including three bonding levels and one exposed level. Each of the three bonding levels and the one exposed level is positioned in a different horizontal plane, with each bonding level providing a bonding site vertically positioned relative to the horizontal plane of the exposed level, with each bonding site coupled to a package lead at the exposed level. Bonding sites located at first and second bonding levels can be located in a common, outer row, along a common, vertical plane, and bonding sites located at a third bonding level can be located in a separate, inner row, along a separate vertical plane. A third level bonding site can be coupled to a first level bonding site with a multiple level electrical lead conductor that vertically spans a second bonding level. A two-step etch process from a single sheet conductor is provided to manufacture the multi-level leadframe.

14 Claims, 4 Drawing Sheets

(52) U.S. Cl.
CPC ............... *H01L 2224/49171* (2013.01); *H01L 2224/49175* (2013.01); *H01L 2224/49177* (2013.01)

(56) References Cited

U.S. PATENT DOCUMENTS

| | | |
|---|---|---|
| 8,222,716 B2 | 7/2012 | Bayan |
| 2003/0011054 A1* | 1/2003 | Jeun ...................... H01L 21/565 |
| | | 257/678 |
| 2007/0130759 A1 | 6/2007 | Hamden et al. |
| 2011/0089546 A1 | 4/2011 | Bayan |
| 2012/0241930 A1 | 9/2012 | Liu et al. |
| 2016/0240390 A1 | 8/2016 | Lee et al. |
| 2016/0293543 A1* | 10/2016 | Otremba ........... H01L 23/49562 |

* cited by examiner

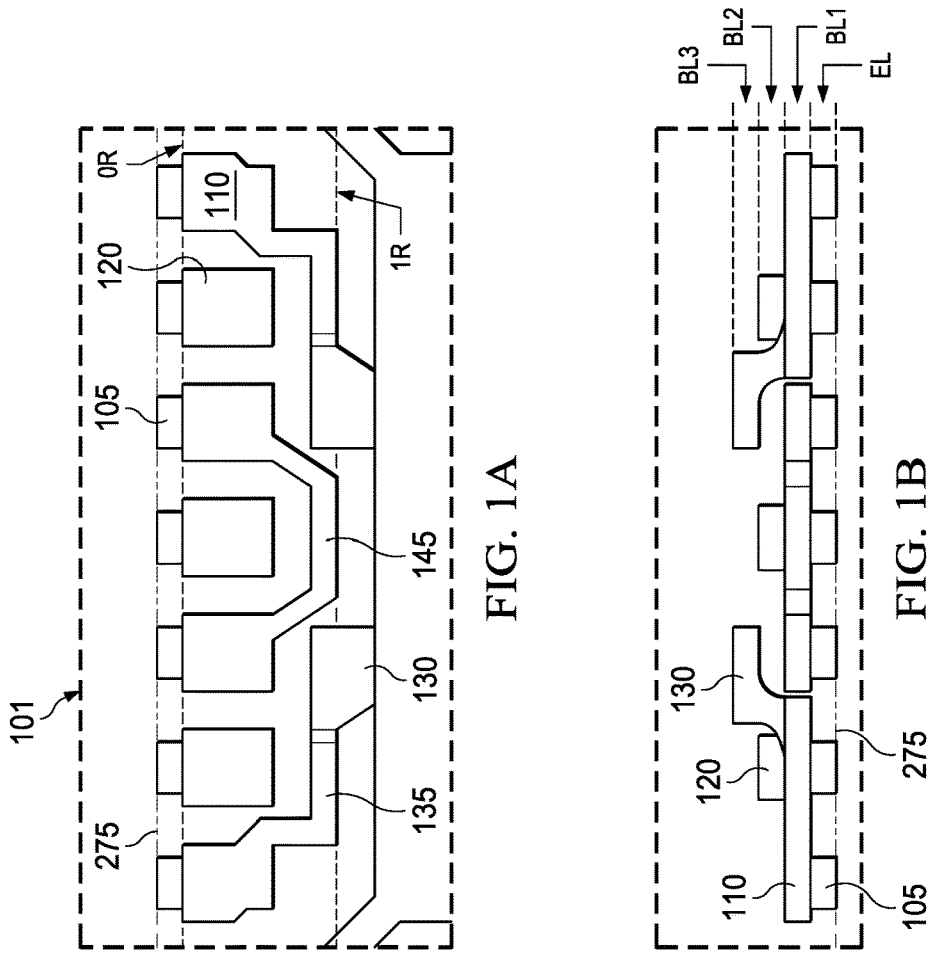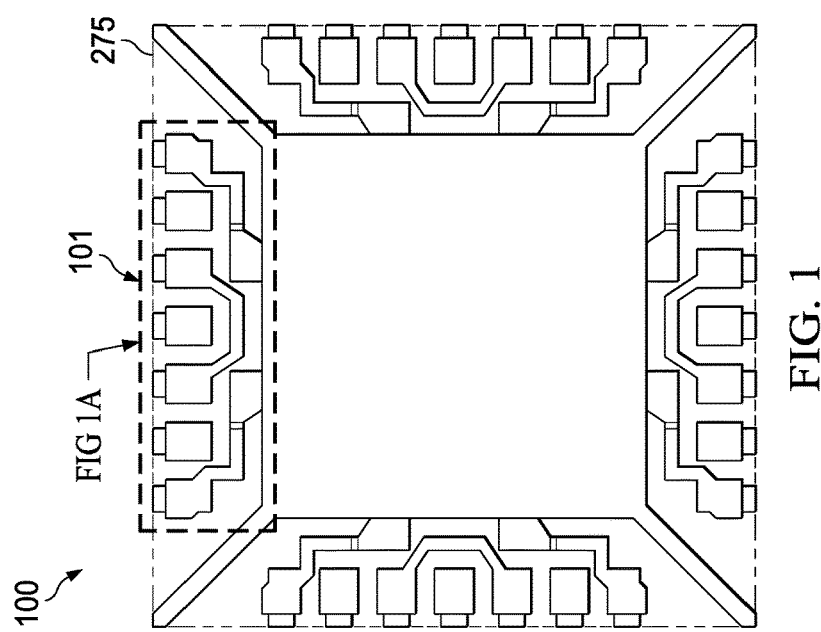

US 10,361,098 B2

1

QFN PIN ROUTING THRU LEAD FRAME ETCHING

RELATED APPLICATION

This application claims benefit of priority of U.S. Provisional Application Ser. No. 62/438,925, filed Dec. 23, 2016; which application is incorporated herein by reference.

BACKGROUND

Some integrated circuit die are difficult to package in modern no-lead packages due to the long bond wires and complex bond wire layouts required. The long bond wires and crossing patterns risk bond wires sagging into other connections or into the integrated circuit die, and the long wires are also prone to side-to-side movement which also can lead to short circuits or other damage.

SUMMARY

A multi-level leadframe can alleviate the above-identified issues. A multi-level leadframe can provide elevated bonding sites positioned to avoid wire sweeps, sags, risks of short circuits and other damage. Signals from the bond sites can be routed to the package leads by the multilevel leadframe, providing a cost effective and highly manufacturable package.

In one aspect, the multi-level leadframe cab be formed from a single sheet conductor and partially etched for multiple levels of conductors within the single sheet conductor. The multiple levels could also be formed by deposition of conductive material, such as through 3D printing using conductive inks.

In accordance with one example, a multi-level leadframe includes three bonding levels and one exposed level. Each of the three bonding levels and the exposed level is positioned in a different horizontal plane. Each of the three bonding levels provide at least one bonding site vertically positioned relative to the horizontal plane of the exposed level, with each bonding site coupled to a package lead at the exposed level.

In accordance with another example, a packaged integrated circuit includes a multi-level leadframe, an integrated circuit die attached to the multi-level leadframe, and mold compound covering at least portions of the integrated circuit die and the multi-level leadframe. The multi-level leadframe includes three bonding levels and one exposed level. Each of the three bonding levels and the one exposed level is positioned in a different horizontal plane. Each of the three bonding levels provide at least one bonding site vertically positioned relative to the horizontal plane of the exposed level, with each bonding site coupled to a package lead at the exposed level. A bonding site located at a third bonding level of the three bonding levels is coupled to a bonding site located at a first bonding level of the three bonding levels with a multiple level electrical lead conductor. The multiple level electrical lead conductor vertically spans a second bonding level of the three bonding levels. Bonding sites located at the third bonding level of the three bonding levels are located in a separate row, along a separate vertical plane, relative to bonding sites of the first and the second bonding levels of the three bonding levels.

In accordance with a further example, a method of making an integrated circuit package includes the steps of forming a multi-level leadframe by placing at least one mask on a top side and on a bottom side of a single conductive sheet, and

2 etching the single conductive sheet from both sides to form a thinner region within a frame region for bonding sites and lead conductors. The thinner region represents a top of a second bonding level, at a top of a second level bonding site. After the first etching, placing, if necessary, at least one mask on a top side and on a bottom side of the single conductive sheet or on a top side and on a bottom side of the thinner region, then etching the conductive sheet from both sides to form a still thinner region within a frame region for at least bonding sites. The still thinner region represents a top of a first bonding level, at a top of a first level bonding site, and a bottom of a third level bonding site. In this aspect, the method of making an integrated circuit package can also include the steps of placing an integrated circuit die on a die attach pad of the multi-level leadframe, wire-bonding bond wires to connection pads of the integrated circuit die and to bonding sites of the multi-level leadframe, and encapsulating at least portions of the integrated circuit die and the multi-level leadframe with molding compound. The method of making an integrated circuit package can further include chemically processing a semiconductor wafer to form multiple integrated circuit dies arranged in an array across a surface of the semiconductor wafer, and then singulation of the integrated circuit die prior to placement of the integrated circuit die on the die attach pad of the multi-level leadframe.

BRIEF DESCRIPTION OF THE DRAWINGS

For a detailed description of various examples, reference will now be made to the accompanying drawings in which:

FIG. 1 illustrates one aspect of a multi-level leadframe of a QFN package, in accordance with various examples;

FIGS. 1A and 1B illustrate a top view and a side view, respectively, of a portion of the multi-level leadframe of FIG. 1;

DETAILED DESCRIPTION

Figure 2:
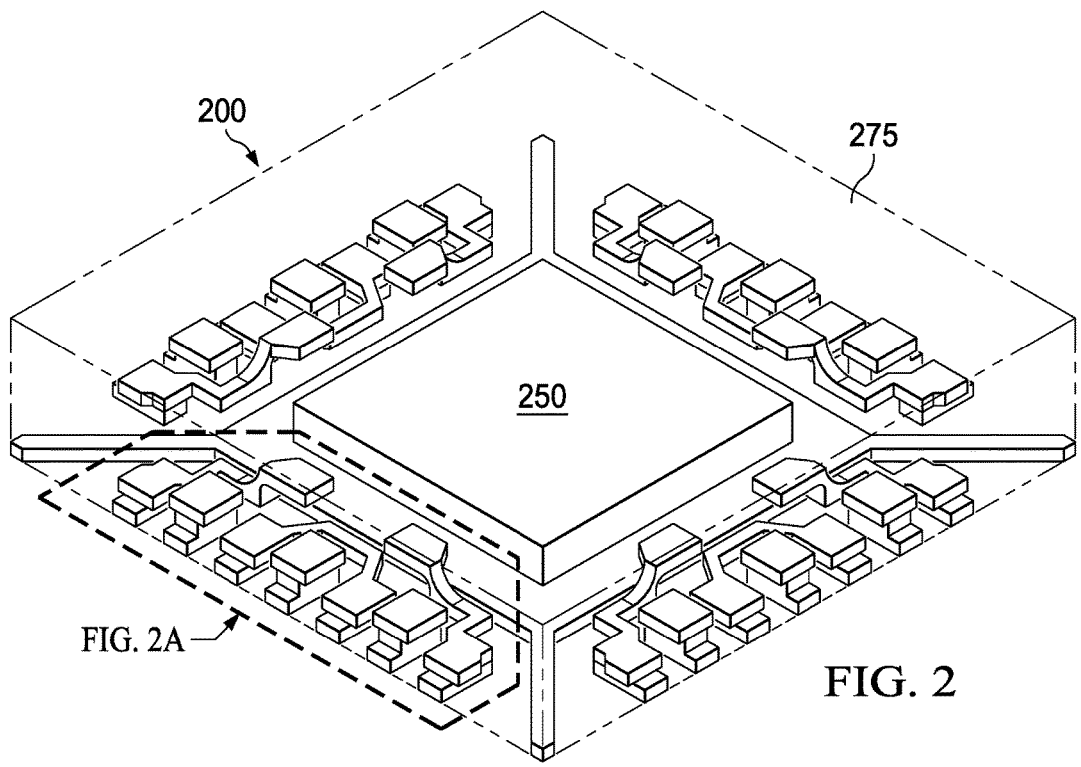
FIG. 2 illustrates a perspective view of a semiconductor integrated circuit package, including an integrated circuit die and the multi-level leadframe of FIG. 1, in accordance with various examples.

Specific aspects and examples will now be described in detail with reference to the accompanying figures. Like elements in the various figures are denoted by like reference numerals for consistency. In the following detailed description, numerous specific details are set forth in order to provide a more thorough understanding. However, it will be apparent to one of ordinary skill in the art that the certain described aspects may be practiced without these specific details. In other instances, well-known features have not been described in detail to avoid unnecessarily complicating the description.

Certain terms are used throughout the following description and claims to refer to particular system components. As one skilled in the art will appreciate, different parties may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

FIG. 1 illustrates a top view of example of pin routing of a quad flat no leads (QFN) package 100. Aspects are also applicable to integrated circuit packages other than QFN. FIGS. 1A and 1B illustrate a top view, and a side view, respectively, of a portion of FIG. 1, showing a multi-level leadframe 101 having three bonding levels and one exposed level, each level being positioned in a different vertical plane, with each bonding level providing at least one bonding site vertically positioned relative to the horizontal plane of the exposed level, with each bonding site coupled to a package lead at the exposed level. The exposed level may or may not be encapsulated (or completely encapsulated) within mold compound. The exposed level is the leadframe level having a plurality of conductive members exposed outside (extending from) the mold encapsulation compound (and outside the integrated circuit package) to provide externally-accessible connections (package leads) to the semiconductor die.

FIGS. 1, 1A and 1B illustrates an exposed level or exposed side EL, having package leads 105 located thereon. Also illustrated is a first bonding level BL1, a second bonding level BL2, and a third bonding level BL3. In this aspect, the multi-level leadframe includes four levels, three bonding levels and one exposed, or package lead level. Each of the three bonding levels BL1, BL2, BL3, and the one exposed level EL lies in a separate horizontal plane. Other aspects include two, four or five bonding levels. In this aspect, the four level leadframe, including three bonding levels, can be manufactured from a single leadframe by multiple etching steps.

FIGS. 1, 1A and 1B illustrate first level bonding sites 110, second level bonding sites 120 and third level bonding sites 130. In this aspect, first level bonding sites 110 and second level bonding sites 120 are located in a common, outer row OR. The third level bonding site 130 is located in a separate, inner row IR. The outer row OR and the inner row IR lie in separate vertical planes. Within the inner row IR, the third level bonding sites 130 could be located laterally, along the inner row IR, in variable locations. In other aspects, first and/or second level bonding sites 110, 120 could be located in the inner row IR, or the third level bonding sites 130 could be located in the outer row OR. In this aspect, the third level bonding sites 130 are coupled to respective package leads 105 by a multiple level electrical lead conductor 135. The multiple level electrical lead conductor 135 transitions multiple levels, vertically, and also transitions horizontally, between and along the inner and outer rows IR, OR. A single level electrical lead conductor 145 could also exist, transitioning only horizontally between and/or along the inner and outer rows IR, OR to couple bonding sites of a same vertical level.

As noted, locations of the bonding sites can vary between the inner row and the outer row, can be slightly offset from either row, or can be variably or laterally positioned along either row. Any variable positioning would consider necessary bonding site size, to facilitate bond wire connection, and adequate bonding site clearance distances, both between bonding site and bonding site, and bonding site and passing lead line.

Figure 2A:
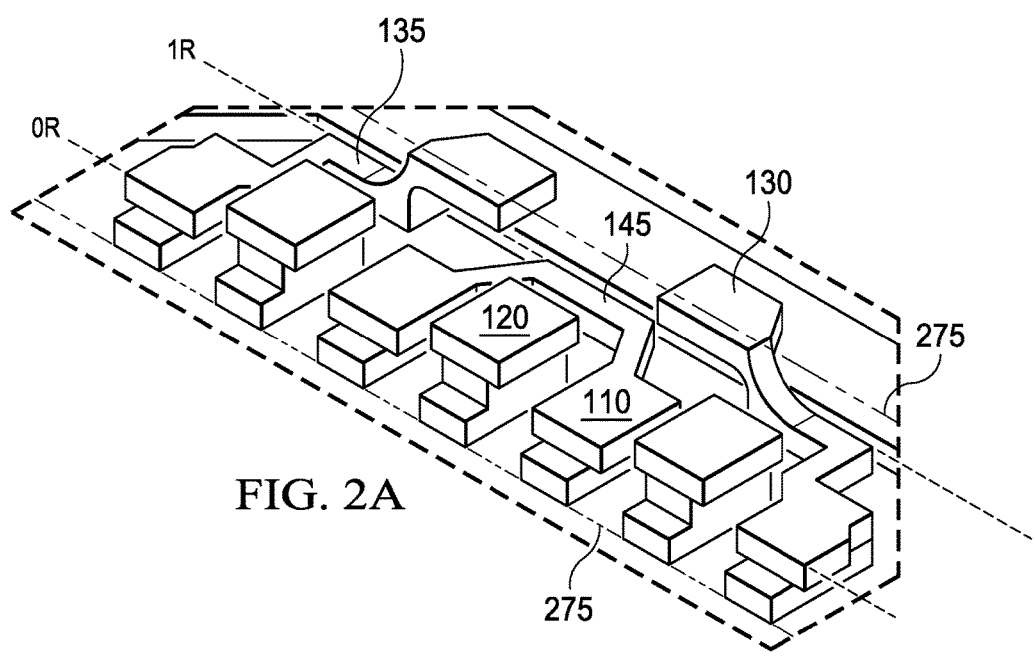
FIGS. 2A and 2B illustrate a perspective top view and a perspective bottom view, respectively, of a portion of the multi-level leadframe shown in FIG. 2.
Figure 2B:
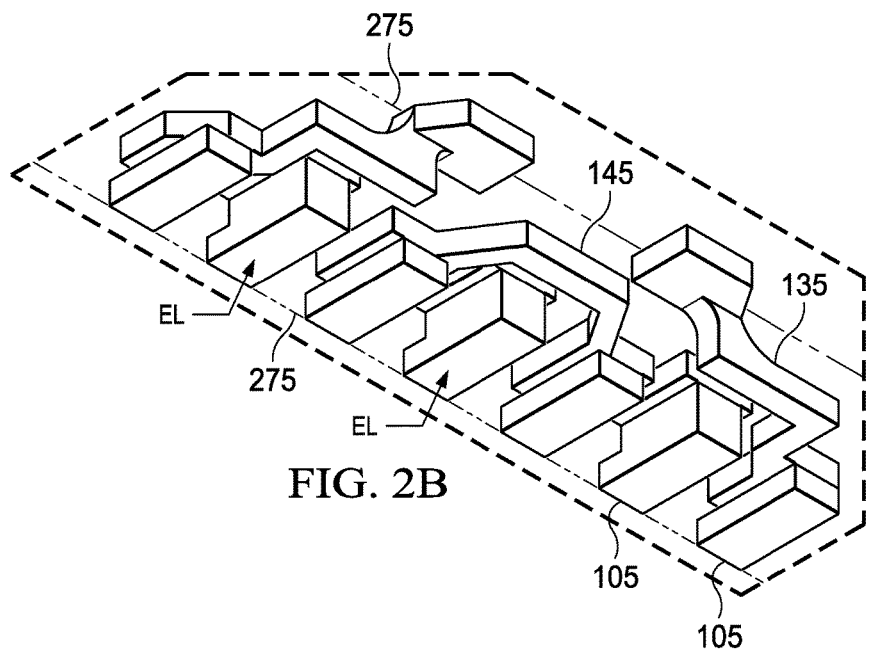

FIG. 2 illustrates a perspective view of a semiconductor integrated circuit package 200, including an integrated circuit die 250, the QFN package 100 of FIG. 1, and mold compound 275. FIGS. 2A and 2B illustrate a top perspective view, and an underside perspective view, respectively, of a portion of FIG. 2, showing the multi-level leadframe having three bonding levels and one exposed level, each level being positioned in a different horizontal plane, with each bonding level providing at least one bonding site vertically positioned relative to the exposed level, with each bonding site coupled to a package lead at the exposed level. FIG. 2A illustrates bondable sides (or tops of bonding sites 110, 120, 130) of each of the multiple bonding levels. FIG. 2B illustrates the under, exposed sides (or the exposed level) EL and package leads 105 extending therefrom. The exposed level EL level may or may not be encapsulated (or completely encapsulated) within the mold compound 275. The mold compound 275 encapsulates the components of the semiconductor integrated circuit package 200. The exposed level EL is the leadframe level having a plurality of conductive members (the package leads 105) extending or exposed outside the mold encapsulation compound 275 (and outside the integrated circuit package 200) to provide externally-accessible connections to the semiconductor die. In one aspect of the disclosure, the underside of the exposed level EL (i.e., the side of the exposed level EL facing away from the three bonding levels BL1, BL2, BL3), and the underside of package leads 105, lie on a plane of the mold encapsulation compound 275, resulting in the underside plane of the exposed level EL and the package leads 105 being exposed from the mold encapsulation compound 275, as shown in various figures.

Figure 3:
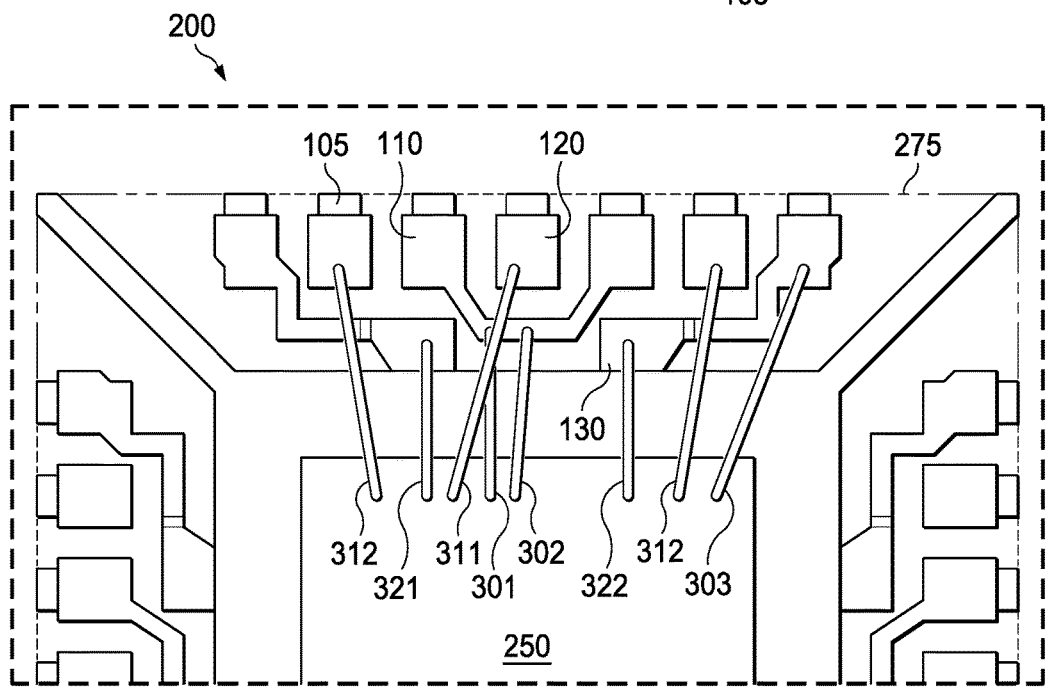
FIG. 3 illustrates a top view of a portion of the semiconductor integrated circuit package of FIG. 2, showing bonding wire connections between the integrated circuit die and various levels of the multi-level leadframe, in accordance with various examples.

FIG. 3 illustrates a top view of the semiconductor integrated circuit package 200, including an integrated circuit die 250 and the QFN package 100, shown in FIG. 2. FIG. 3 illustrates bond wiring, coupling the integrated circuit die 250 to an example multi-level leadframe 101. In FIG. 3, bond wires 301, 302 and 303 illustrate low loop bonding of the die 250 to first level bonding sites 110; bond wires 311, 312 and 313 illustrate medium loop bonding of the die 250 to second level bonding sites 120; and bond wires 321 and 322 illustrate high loop bonding of the die 250 to third level bonding sites 130. Such a wiring configuration, using a multi-level leadframe providing elevated bonding sites, facilitates an avoidance of wire sweeps, sags, and risks of short circuits and other damage. Signals from respective bond sites are routed to the package leads by the multilevel leadframe, providing a cost effective and highly manufacturable package. Note that, as shown in FIG. 3, the low loop bonding of bond wires 301, 302 from the die 250 are to the single level electrical lead conductor 145, at an inner row IR location, instead of to the respective first level bonding sites 110 at the outer row OR location. Either bonding configuration is contemplated.

Figure 4A:
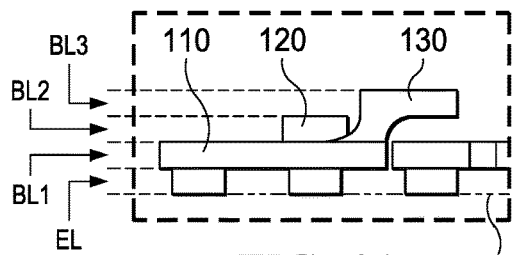
FIGS. 4A and 4B illustrate a side view and a top view, respectively, of a portion of the multi-level leadframe of FIG. 1.
Figure 4B:
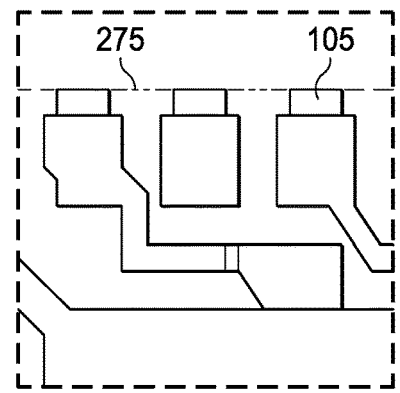
Figure 4C:
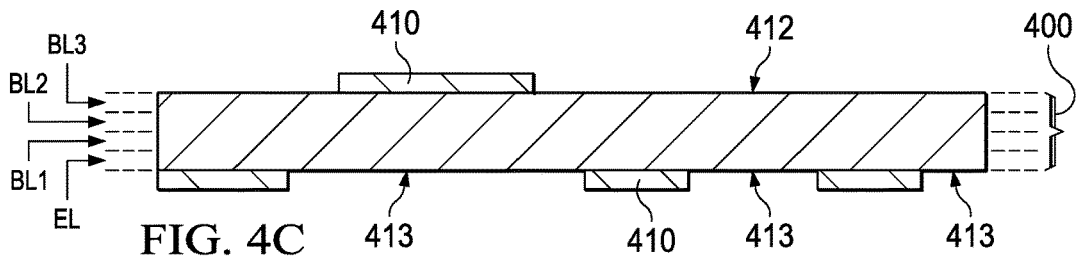
FIG. 4C illustrates a single conductor sheet with masking placed on a top and on a bottom thereof, in preparation for a two-sided, double etch process for forming a multi-level leadframe for an integrated circuit package, in accordance with various examples.
Figure 4D:
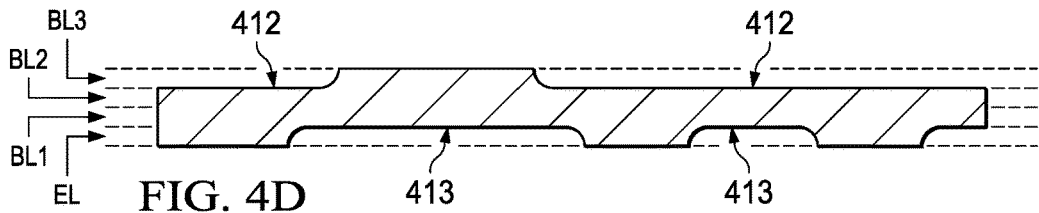
FIG. 4D illustrates the single conductor sheet of FIG. 4C after the first etching of the double etch process for forming a multi-level leadframe for an integrated circuit package, in accordance with various examples.

FIGS. 4A-4F illustrate a two-sided, double etch process for forming the multi-level leadframe 101 shown in FIGS. 1A (top view) and 1B (side view), a portion of each shown in FIGS. 4A (side view) and 4B (top view). Initially, a bare copper sheet is formed into a strip. FIG. 4C illustrates a portion of a copper strip 400 that will be formed into a leadframe. For display purposes in this aspect, the copper strip 400 is shown divided into four vertical levels previously detailed; that is, the exposed level EL, the first bonding level BL1, the second bonding level BL2, and the third bonding level BL3. While a copper sheet is typically used for leadframes, other types of conductive material or alloys of copper may also be used; for example, Cu—Sn, Cu—Fe—P, Cu—Cr—Sn—Zn, etc. Various alloys may be selected based on conductivity, tinsel strength, thermal expansion rates, etc.

FIG. 4C illustrates first etch masks 410 applied to a top and a bottom of the sheet 400, the first etch masks 410 used to form a first etched pattern on the sheet 400. Mask 410 may be formed on the sheet 400 using known application techniques. For example, a photo sensitive mask material may be applied to the sheet 400 and then exposed to light through a reticule that contains an image of the pattern to be etched. Unexposed areas may then be washed away with a suitable solvent. Alternatively, the mask may be applied using a silkscreen process, or other known or later developed application process. Once the first mask 410 is in place, exposed regions such as 412 (top side) and 413 (bottom side) of the sheet 400 are etched away using suitable etchant. The etch process is allowed to proceed to a single level depth (here, BL3 on the top side and EL on the underside), as illustrated upon completion in FIG. 4D.

Figure 4E:
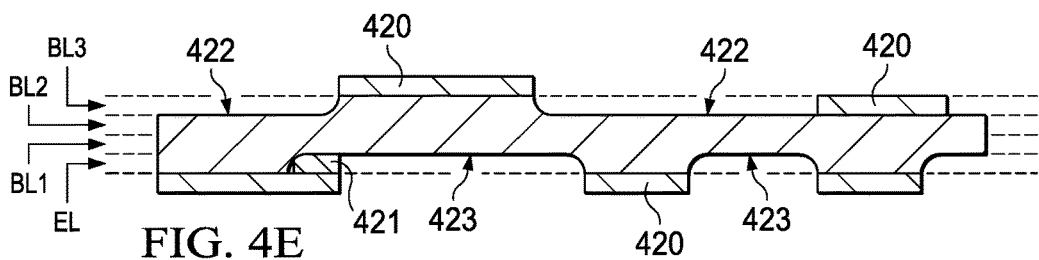
FIG. 4E illustrates the single conductor sheet of FIG. 4D with masking placed on a top and on a bottom thereof, in preparation for a second etching of the double etch process for forming a multi-level leadframe for an integrated circuit package, in accordance with various examples.
Figure 4F:
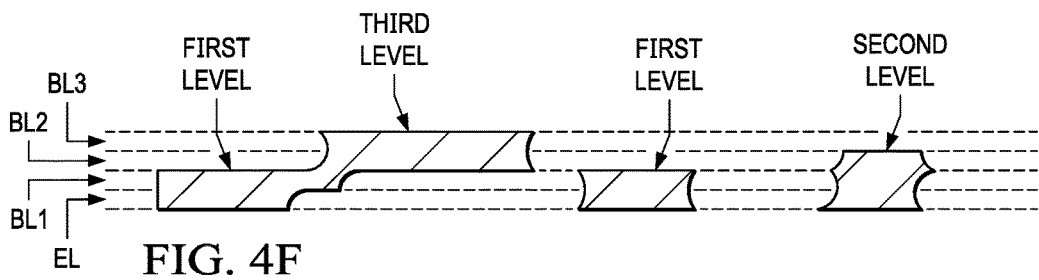
FIG. 4F illustrates the single conductor sheet of FIG. 4E after the second etching of the double etch process for forming a multi-level leadframe for an integrated circuit package, showing three bonding levels and one exposed level, in accordance with various examples.

FIG. 4E illustrates second etch masks 420 applied to a top and a bottom of the sheet 400 after the first etch, the second etch masks 420 used to form a second etched pattern on the sheet 400. Second etch masks 420 may be formed on the sheet 400 using known application or later developed techniques, as described above. Previously etched regions, such as that shown within level BL3, may be covered by a second etch mask 420. Second etch masks 420 may include a floating etch mask 421, to prevent horizontal bleeding during a second etch process of a previously etched region, such as that shown in level EL.

As shown in FIG. 4E, once the second masks 420 are in place, exposed regions, such as 422 (top side) and 423 (bottom side) of the sheet 400 are etched away using suitable etchant. The etch process is again allowed to proceed to a single level depth (here, BL2 on the top side and BL1 on the underside), as illustrated upon completion in FIG. 4F. Alternative depths at each etch step are contemplated. In the manner described, at least three vertical bonding levels BL1, BL2, BL3, each including one or more bond sites, and at least one exposed level EL, including one or more package lead sites, may be formed in a multi-level lead frame, each level including necessary bond and lead site clearance distances.

In another aspect, the order of etching may be different. For example, a top side of the sheet 400 could be etched first, with the bottom side of the sheet 400 being etched second, in a separate operation.

The various methods for forming a multi-level leadframe of an integrated circuit package described above can be included in a method of making an integrated circuit package. In one aspect, a semiconductor wafer is chemically processed to form multiple integrated circuit dies arranged in an array across a surface of the semiconductor wafer. The array of integrated circuit dies are singulated to form individual integrated circuit dies, which are then packaged. An integrated circuit die is placed on a die attach pad of a multi-level leadframe formed by various aspects of the disclosure detailed above. Bond wires are coupled between connection pads of the integrated circuit die and bonding sites of the multi-level leadframe. The integrated circuit die and the multi-level leadframe is then encapsulated with molding compound, which can be ultraviolet or thermally cured, thereby protecting the integrated circuit die. Tips, or package leads, of the leadframe that extend from (or are exposed from) the mold compound encapsulation can be connected to externally accessible connectors.

While aspects of the disclosure have been described with reference to illustrative examples, this description is not intended to be construed in a limiting sense. Various other aspects and examples will be apparent to persons skilled in the art upon reference to this description.

In one example, a wet etch process has been described herein, other known or later developed wet or dry etching processes may be used to form the multi-level leadframes described herein. In another example, the bonding sites (bond sites or bond pads) may be arranged in a different manner; such as bonding sites in the outer row being offset from one another, or alternatively positioned in the inner row, to allow straighter routing of the lead lines or bond wires. In a further example, while the bonding sites illustrated herein are of a certain shape (rectangular or square), other aspects may have the bonding sites of a different shape, such as circular, oval, etc.

Although method steps may be presented and described herein in a sequential fashion, one or more of the steps shown and described may be omitted, repeated, performed concurrently, and/or performed in a different order than the order shown in the figures and/or described herein. Accordingly, aspects described should not be considered limited to the specific ordering of steps shown in the figures and/or described herein.

It is therefore contemplated that the appended claims be interpreted to embrace all such variations and modifications of the aspects described.

What is claimed is:

1. A multi-level leadframe comprising:
   three bonding levels; and
   one exposed level; wherein each of the three bonding levels and the exposed level is positioned in a different horizontal plane, each bonding level providing at least one bonding site vertically positioned relative to the horizontal plane of the exposed level, with each bonding site coupled to a package lead at the exposed level.

2. The multi-level leadframe of claim 1, wherein bonding sites located at a third bonding level of the three bonding levels are coupled to the package lead at the exposed level with a multiple level electrical lead conductor, the multiple level electrical lead conductor vertically spanning a second bonding level of the three bonding levels.

3. The multi-level leadframe of claim 1, wherein a bonding site located at a third bonding level of the three bonding levels is coupled to a bonding site located at a first bonding level with a multiple level electrical lead conductor, the multiple level electrical lead conductor vertically spanning a second bonding level of the three bonding levels.

4. The multi-level leadframe of claim 1, wherein bonding sites located at first and second bonding levels of the three bonding levels are located in a common, outer row, along a common, vertical plane.

5. The multi-level leadframe of claim 1, wherein bonding sites located at a third bonding level of the three bonding levels are located in a separate row, along a separate vertical plane, relative to bonding sites of first and second bonding levels of the three bonding levels.

6. The multi-level leadframe of claim 1, wherein bonding sites located at first and second bonding levels of the three bonding levels are located in a common, outer row, along a common, vertical plane, and bonding sites located at a third bonding level of the three bonding levels are located in a separate, inner row, along a separate vertical plane.

7. The multi-level leadframe of claim 1, wherein at least two bonding sites located at a common bonding level of the three bonding levels are coupled to one another with a single level electrical lead conductor, the single level electrical lead conductor transitioning horizontally, along either an inner row or an outer row to couple the at least two bonding sites located at the common bonding level.

8. The multi-level leadframe of claim 7, wherein the single level electrical lead conductor further transitions horizontally between the inner row and the outer row.

9. The multi-level leadframe of claim 1, wherein the multi-level leadframe is constructed from a single leadframe.

10. A packaged integrated circuit comprising:
an integrated circuit die attached to the multi-level leadframe of claim 1.

11. A packaged integrated circuit comprising:
a multi-level leadframe including three bonding levels and one exposed level; wherein:
each of the three bonding levels and the exposed level is positioned in a different horizontal plane;
each of the three bonding levels provide at least one bonding site vertically positioned relative to the horizontal plane of the exposed level;
each bonding site is coupled to a package lead at the exposed level;
a bonding site located at a third bonding level of the three bonding levels is coupled to a bonding site located at a first bonding level of the three bonding levels with a multiple level electrical lead conductor, the multiple level electrical lead conductor vertically spanning a second bonding level of the three bonding levels; and
bonding sites located at the third bonding level of the three bonding levels are located in a separate row, along a separate vertical plane, relative to bonding sites of the first and the second bonding levels of the three bonding levels;
an integrated circuit die attached to the multi-level leadframe; and
mold compound covering at least portions of the integrated circuit die and the multi-level leadframe.

12. The packaged integrated circuit of claim 11, wherein bonding sites located at the first and the second bonding levels of the three bonding levels are located in a common row, along a common, vertical plane, separate from the row of the bonding sites of the third bonding level of the three bonding levels.

13. The packaged integrated circuit of claim 11, wherein at least two bonding sites located at a common bonding level of the three bonding levels are coupled to one another with a single level electrical lead conductor, the single level electrical lead conductor transitioning horizontally, along either an inner row or an outer row of the multi-level leadframe, to couple the at least two bonding sites located at the common bonding level.

14. The packaged integrated circuit of claim 11, wherein:
bonding sites located at the first and the second bonding levels of the three bonding levels are located in a common, inner row, relative to the integrated circuit die, the inner row located on a vertical plane separate from the row of the bonding sites of the third bonding level of the three bonding levels, the row of the bonding sites of the third bonding level being an outer row relative to the integrated circuit die; and
at least two bonding sites located at a common bonding level of the three bonding levels are coupled to one another with a single level electrical lead conductor, the single level electrical lead conductor transitioning horizontally between the inner row and the outer row of the multi-level leadframe to couple the at least two bonding sites located at the common bonding level.

* * * * *